United States Patent [19]
Sonntag et al.

[11] Patent Number: 5,750,924
[45] Date of Patent: May 12, 1998

[54] ELECTRONICS AND INSTRUMENTATION ENCLOSURE

[75] Inventors: John-Erik Sonntag, Tammisaari; Matti Ropponen, Espoo, both of Finland

[73] Assignee: Fibox Oy AB, Jorvas, Finland

[21] Appl. No.: 533,720

[22] Filed: Sep. 26, 1995

[30] Foreign Application Priority Data

Nov. 25, 1994 [FI] Finland .................................. 945563

[51] Int. Cl.$^6$ .................................................. H02G 3/08
[52] U.S. Cl. ..................................... 174/50; 220/3.8
[58] Field of Search ...................... 174/50, 66; 220/3.8, 220/241, 324, 326, 354; 70/158, 160, 161, 163; 403/348, 349, 325, 354

[56] References Cited

U.S. PATENT DOCUMENTS

| | | | |
|---|---|---|---|
| 4,291,817 | 9/1981 | Spitzer et al. | 220/327 |
| 4,551,999 | 11/1985 | Guiler | 70/159 |
| 5,056,764 | 10/1991 | Mochizuki | 267/291 |
| 5,419,626 | 5/1995 | Crockett | 312/7.2 |

*Primary Examiner*—Bot L. Ledynh
*Assistant Examiner*—Dhiru R. Patel
*Attorney, Agent, or Firm*—Merchant, Gould, Smith, Edell, Welter & Schmidt, P.A.

[57] ABSTRACT

An electronics and instrumentation enclosure includes a lower portion (4) and a cover (1), which have corner turrets (6 and 3, respectively) provided with through openings (5 and 2, respectively). The cover (1) can be locked to the lower portion (4). Upper locking device includes a locking member (7, 9) having a locking element (19, 20) and lower locking device includes a locking slot (21, 22) for receiving the locking element (19, 20). In a locked position, the locking element (19, 20) is kept in the locking slot (21, 22) by means of a spring element (8). When the lock is in an open position, the cover (1) can be lifted apart from the lower portion (4), whereby a locking member (7, 9) is also detached from a locking ring (16). For the purpose that the locking devices would not suppose the structure of the lower portion (4) of the enclosure to be different from the conventional structure and that existing mould tools and existing enclosure structures could be utilized, the locking slot (21, 22) is formed in a locking ring (16) mounted in the corner turret (6) of the lower portion (4) of the enclosure by ultrasonic welding or glueing and provided with a through opening (28). Alternatively, the locking ring can be turned into the threads of the corner turret and locked in its place by means of an expansion member.

18 Claims, 2 Drawing Sheets

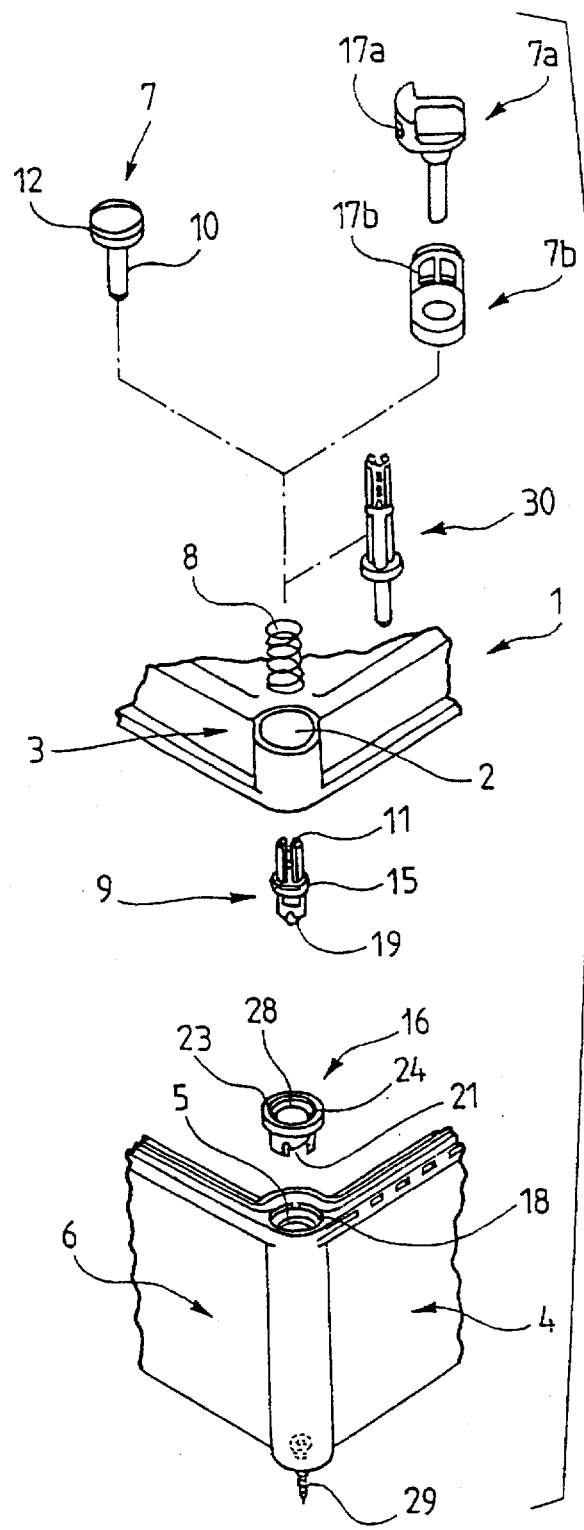
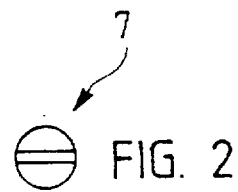
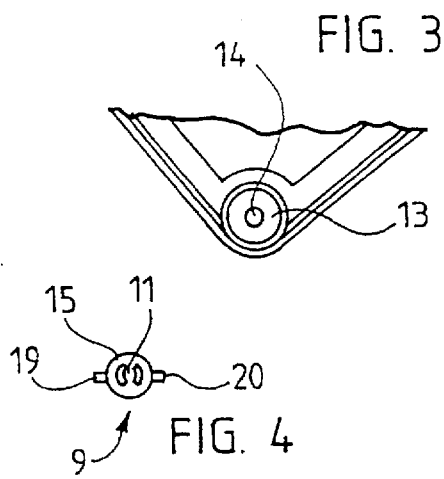
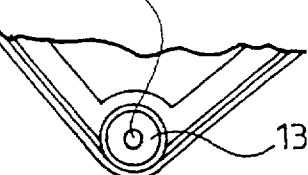
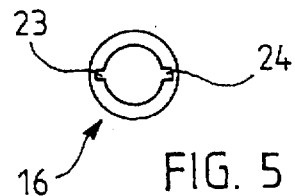
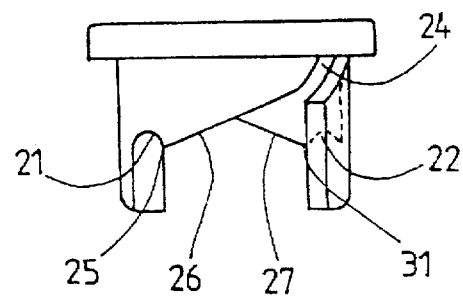

ELECTRONICS AND INSTRUMENTATION ENCLOSURE

BACKGROUND OF THE INVENTION

The invention relates to an electronics and instrumentation enclosure to be used for electronic, electric and instrument installations, the enclosure comprising a lower portion having corner turrets provided with through openings and a cover having corner turrets provided with through openings, which cover can be locked to the lower portion by means of a lock comprising upper locking means arranged in the opening of the corner turret of the cover and lower locking means arranged in the opening of the corner turret of the lower portion of the enclosure, whereby said locking means communicate with each other to provide a locking, the upper locking means comprising a locking member having a projecting locking element and the lower locking means comprising a locking slot formed in the corner turret of the lower portion, whereby the locking element of the locking member can be arranged between locked and open position in such a way that, in locked position, it is in said locking slot, where it is kept by a spring element for locking the cover to the lower portion, and in open position, it is removed from the locking slot, when it can be lifted apart from the lower locking means for releasing the cover from the lower portion. The enclosure is preferably intended for measuring and regulating equipments.

In known enclosures, the upper locking means are usually constituted by a locking screw, while the lower locking means are constituted by a corner sleeve arranged in the opening of the corner turret of the lower portion and provided with internal threads for the locking screw. The corner sleeve is mounted in the corner turret by ultrasonic welding or glueing. It is a rather slow procedure to turn the locking screw into the corner sleeve. A screwdriver is required. If the enclosure must be maintained frequently, a possibility of opening it quickly would be desirable. Additionally, locking screws may get lost, since they are loose parts. Further, even if it is relatively easy to seal screws by painting the screw heads, they cannot be locked. A possibility of locking is sometimes very important.

An enclosure is known, which comprises quick-locking means for locking the cover to the lower portion. The problem with this known enclosure is that the locking means require the corner turret of the lower portion of the enclosure to be formed in such a way that it differs from a conventional corner turret and comprises dirt accumulating holes, which is not acceptable in the chemical and food industry, for instance. It is thus not possible either to use old mould tools for manufacturing a quick-locked enclosure or to provide conventional existing enclosures intended to be screw-locked with locking means of quick-lock type afterwards.

SUMMARY OF THE INVENTION

The object of the present invention is to introduce a novel electronics and instrumentation enclosure comprising a novel locking structure, by means of which the above problems are eliminated.

To achieve the above objects, the present invention provides an enclosure of the afore-mentioned type, wherein the locking slot is formed in a locking ring mounted in the corner turret of the lower portion of the enclosure and provided with a through opening. The locking ring is mounted in the corner turret for example by ultrasonic welding or glueing. In an analog embodiment of the present invention of the afore-mentioned type, which embodiment is especially suitable for field installation, the locking slot is formed in a locking ring to be mounted into internal threads of the corner turret of the lower portion and provided with an expansion slot, which locking ring comprises external threads for said mounting, while the lower locking means additionally comprise an expansion member to be pushed into the locking ring for expanding the expansion slot of the locking ring in such a way that the locking ring is locked to the corner sleeve. The locking member preferably comprises a head part and a locking part provided with said projection, which parts can be fastened to each other by means of a snap joint.

Preferred embodiments of the enclosure according to the invention are set forth in the attached claims 2 and 4 to 18.

The invention is based on the idea to provide quick-locking means by using a separate component (locking ring), which means can be employed in conventional type enclosures provided with corner turrets.

The most important advantages of the enclosure according to the invention are that the locking means of the cover do not require the structure of the lower portion of the enclosure to differ from the conventional one. Accordingly, existing mould tools can be used without necessitating manufacturing very expensive new tools for producing enclosures of different shapes and sizes. In one embodiment of the invention, quick-locking can be changed into conventional screw locking afterwards, if desired, which is not possible in the known enclosure solution provided with quick-locking. Thanks to the fact that the locking ring comprises a through hole, the lower portion can be mounted with screws in its final place, after the locking ring has been mounted. Accordingly, the locking ring can be either factory-mounted, by glueing or ultrasonic welding, for instance, or intended to be mounted by an installer on site, in which case it comprises threads. During the mounting of the lower portion, the screwdriver is kept inserted through said hole, and therefore, no external mounting lugs etc. are needed.

BRIEF DESCRIPTION OF THE DRAWINGS

The invention will be described in the following in greater detail by means of one preferred embodiment with reference to the attached drawing, in which FIG. 1 shows an exploded view of a lock of an enclosure according to the invention, FIG. 2 shows a head part of an upper locking means of the lock of FIG. 1 from above, FIG. 3 shows a corner portion of a cover of FIG. 1 from above, FIG. 4 shows a locking part of the upper locking means of the lock of FIG. 1, FIG. 5 shows a locking ring of a lower locking means of the lock of FIG. 1, FIG. 6 shows the locking ring of the lock of FIG. 1 enlarged from the side and FIG. 7 shows an alternative manner of implementing the lower locking means of the lock.

DETAILED DESCRIPTION OF THE PREFERRED EMBODIMENTS

Figure 7:
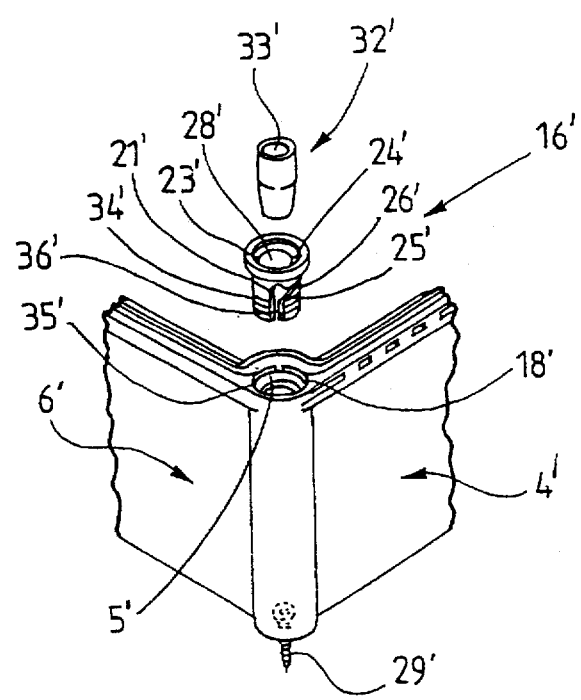

Reference numeral 1 in FIG. 1 indicates a cover of an electronics and instrumentation enclosure and more precisely its corner portion having a corner turret 3 provided with an opening 2. The cover 1 is of a known type.

Reference numeral 4 indicates a lower portion of the enclosure and more precisely its corner portion having a corner turret 6 provided with an opening 5.

A lock of the enclosure is constituted by an upper and a lower locking means, the first-mentioned being intended to be arranged in the opening 2 of the corner turret 3 of the cover 1 and the last-mentioned in the opening 5 of the corner turret 6 of the lower portion 4.

The upper locking means comprises a head part 7, a pressure spring 8 and a locking part 9. The head part 7 comprises a shaft-shaped male part 10 insertable into a receiving female part, i.e. a recess 11, of the locking part 9 by means of a snap joint. For this purpose, the male part 10 of the head part comprises a crocodile clip (not shown in the figures). The pressure spring 8 is positioned between a ring flange 12 of the head part 7 and the locking part 9. The head part 7 does not absolutely need a ringe flange 12, if the diameter of the head is big enough, so that it does not fit inside the inner diameter of the spring 8. The spring 8 is supported below on a shoulder 13 in the opening 2, as seen from FIG. 3. Reference numeral 14 indicates a hole for the shaft or male part 10 of the head part. The locking part 9 is mounted to the head part 7 below the shoulder 13. The biggest diameter of the locking part 9 is bigger than the smallest diameter of the opening 2 of the corner turret, the smallest diameter being the diameter of the hole 14. A flange 15 of the locking part 9 prevents the locking part from penetrating through the hole 14.

FIG. 2 shows the head part 7 from above. It is seen that the head part is shaped like a key, due to which it is easy to turn. Instead of a key-type head part, a head part can be used the upper end of which is provided with a cross slot for a crosshead screwdriver. According to FIG. 1, the head part can alternatively be constituted by two parts 7a and 7b having openings 17a, 17b and being turnable with respect to each other in such a way that said openings 17a, 17b may be positioned in line for mounting a jack lock or a seal through the openings.

The lower locking means of the lock is constituted by a locking ring 16, which is mounted in a corner sleeve 18 in the corner turret 6 of the lower portion 4 by ultrasonic welding. The locking ring could alternatively be mounted by glueing. It is also conceivable that the locking ring is mounted directly on the wall of the corner turret. Ultrasonic welding or glueing is performed at the manufacturing stage of the enclosure.

When the lock is in locked position, the locking part 9 is situated in an opening 28 of the locking ring 16. The lower end of the locking part 9 comprises two projecting pin-like parts 19 and 20 acting as locking means, forming an angle of 180° with respect to each other and being mainly perpendicular to the axial direction of the locking ring 16. The ring part 16 comprises two locking slots 21, 22 and grooves 23, 24, respectively. In locked position, the pin-like parts 19, 20 are kept in the locking slots 21, 22 by the load of the spring 8. When the lock is desired to be in open position, the head part 7 is pressed downwards so much that the pin-like parts 19, 20 are detached from the locking slots 21, 22 and will be lower than spacers 25, 31, and subsequently, the head part is turned slightly anti-clockwise, whereby the spacers are passed and the head part is allowed to rise under the influence of the load of the spring 8. When the head part 7 moves upwards, the pin-like parts 19, 20 will be guided at first along oblique guide surfaces 26, 27 of the locking ring 16 and then along the grooves 23, 24, into which the guide surfaces 26, 27 lead. When the pin-like parts 19, 20 are in the grooves 23, 24, the locking part 9 can be detached from the locking ring 16 simply by lifting, due to which the cover 1 is also detached from the lower portion 4. Then naturally, the locks of all corner turrets must be opened.

Thanks to the through opening 28 of the locking ring 16 and a hole in the bottom of the corner turret 6 of the lower portion, the lower portion 4 of the enclosure can be mounted with a screw 29 on a wall or another base by a screwdriver, which is inserted through said holes while screwing goes on.

FIG. 7 shows an alternative manner of implementing lower locking means of a lock. The arrangement of FIG. 7 is intended for field installation. At field installation, ultrasonic welding is not possible and it is difficult to glue a locking ring in its place. A cover of an enclosure with upper locking means corresponds to the one shown in FIGS. 1 to 5. Also in the embodiment of FIG. 7, a locking ring 16' provided with an opening 28' is used, the locking ring comprising locking slots 21', oblique guide surfaces 26' and grooves 23', 24'. The embodiment of FIG. 7 differs from the embodiment of the FIGS. 1, 5 and 6 in such a way that the locking ring 16' comprises below threads 34' for mounting the ring into internal threads 35' in a corner sleeve 18'. Additionally, the locking ring 16' comprises at least one expansion slot 36'. The locking ring 16' can be locked to the corner sleeve 18' by means of an expansion member 32'. The expansion member 32' is conical below and it is inserted into the opening 28' of the locking ring 16' for expanding the expansion slot 36' in such a way that the locking ring is locked unturnably to a desired position in the corner turret. The expansion member 32' itself is mounted to the locking ring 16' by means of friction. The upper end of the expansion member 32' is situated below a guide surface 26' when it is in place, which makes it possible to insert the locking piece 9 corresponding to FIG. 1 into the locking ring into locked position and to detach it from locked position.

The expansion member 32' has a through hole 33', by means of which it can be easily removed from the locking ring 16' by pulling. In principle, the hole 33' makes it possible that a screwdriver can be passed through for turning a screw 29', but normally the expansion member is not positioned in place when the screw is turned. The head of the screw 29' may be small, in which case a base plate is used. Instead of pulling up the expansion member 32', it can be removed from the locking ring 16' by pushing it through the locking ring 16', so that it falls inside a corner turret 6'. Then the locking ring 16' is released and it can be turned out of the corner turret. Said pushing has to be carried out forcefully in order to open the friction mounting. A possibility of removing the locking ring may be important for instance if the lock shall be changed into a conventional lock constituted by a screw, which is mounted into the threads of the corner sleeve 18'.

The invention has been described above by means of one preferred embodiment only and it is pointed out therefore that the details of the invention may be accomplished in many ways within the scope of the attached claims. Accordingly, the design of the locking slots and grooves of the locking ring may vary from the above. The pin-like parts of the locking part may be replaced by corresponding projecting elements. The number of the last-mentioned as well as the number of the locking slots and grooves need not necessarily always be two of each, although it is to be recommended in view of the symmetric and accurate operation of the lock. Sliding surfaces of the locking ring are not essential either, but they facilitate the use of the lock greatly. If the cover is high, it is conceivable that the upper locking means comprises an adapter part 30 (cf. FIG. 1), the lower end of which corresponds to the shaft of the head part and the upper end of which corresponds to the upper part of the locking part and which comprises a recess for receiving the male part of the head part.

We claim:

1. An electronics and instrumentation enclosure for electronic, electric and instrument installations, the enclosure comprising:
    a lower portion having a plurality of corner turrets each provided with a through opening;
    a cover having a plurality of corner turrets each provided with a through opening;
    a lock for locking the cover to the lower portion, said lock comprising upper locking means arranged in the through opening of one of the corner turrets of the cover and lower locking means arranged in the through opening of one of the corner turrets of the lower portion of the enclosure, said upper and lower locking means being in communication with each other to provide said lock, the upper locking means comprising a locking member having a projecting locking element and the lower locking means comprising a locking slot formed in one of the corner turrets of the lower portion, the locking element of the locking member being arranged between a locked position and an open position in such a way that, in the locked position, the locking element is locked in the locking slot, where the locking element is kept by a spring element for locking the cover to the lower portion, and in the open position, the locking element is removed from the locking slot, when the locking element is lifted apart from the lower locking means for releasing the cover from the lower portion; and
    wherein the locking slot is formed in a locking ring mounted in one of the corner turrets of the lower portion of the enclosure and provided with a through opening.

2. An electronics and instrumentation enclosure according to claim 1, wherein the locking ring is mounted in one of the corner turrets of the lower portion by ultrasonic welding or gluing.

3. An electronics and instrumentation enclosure according to claim 1, wherein the locking member is arranged between said locked and open positions by being pressed down and turned, whereby in the open position, the locking element of the locking member is arranged to move freely in an axial direction of the locking ring in a groove of the locking ring.

4. An electronics and instrumentation enclosure according to claim 3, wherein the locking element of the locking member is constituted by two pin-like parts forming an angle of 180° with respect to each other and being mainly perpendicular to a longitudinal axis of the locking member, whereby the locking ring comprises two locking slots and two grooves, respectively, the two locking slots and the grooves form an angle of 180° with respect to each other and are mainly perpendicular to the axial direction of the locking ring.

5. An electronics and instrumentation enclosure according to claim 4, wherein an oblique guide surface extends from each of the two locking slots of the locking ring, which surface guides, under the influence of a load of the spring element, said locking element into each of the grooves and to the open position, when a spacer at the locking slot has been passed.

6. An electronics and instrumentation enclosure according to claim 1, wherein the locking member comprises a head part and a locking part provided with said projecting locking element, which parts are mounted to each other by means of a snap joint.

7. An electronics and instrumentation enclosure according to claim 6, wherein the head part is key-shaped and comprises a head and a related male part, which is intended to be mounted into a recess in the locking part.

8. An electronics and instrumentation enclosure according to claim 7, wherein the spring element is a pressure spring arranged in a through opening of the corner turret of the cover in such a way that a lower end of the cover is supported on a shoulder in the through opening of one of the corner turrets of the cover, while an upper end of the cover is supported on a ring flange in the head part.

9. An electronics and instrumentation enclosure according to claim 8, wherein a biggest diameter of the locking part is bigger than a smallest diameter of the through opening of one of the corner turrets, which prevents the locking part from passing through the through opening of one of the corner turrets when the projecting locking element of the locking part has been released from the locking ring.

10. An electronics and instrumentation enclosure according to claim 6, wherein an upper end of the head part comprises two parts each having an opening, which parts are turnable with respect to each other in such a way that said openings of the two parts are positioned in line with respect to each other for mounting a jack lock or a seal through the openings of the two parts.

11. An electronics and instrumentation enclosure for electronic, electric and instrument installations, the enclosure comprising:
    a lower portion having a plurality of corner turrets each provided with a through opening;
    a cover having a plurality of corner turrets each provided with through opening;
    a lock for locking the cover to the lower portion, said lock comprising upper locking means arranged in the through opening of one of the corner turrets of the cover and lower locking means arranged in the through opening of one of the corner turrets of the lower portion of the enclosure, said locking means being in communication with each other to provide said lock, the upper locking means comprising a locking member having a projecting locking element and the lower locking means comprising a locking slot formed in one of the corner turrets of the lower portion, the locking element of the locking member being arranged between a locked position and an open position in such a way that, in the locked position, the locking element is in said locking slot, where the locking element is kept by a spring element for locking the cover to the lower portion, and in the open position, the locking element is removed from the locking slot, when the locking element is lifted apart from the lower locking means for releasing the cover from the lower portion; and
    wherein the locking slot is formed in a locking ring to be mounted into internal threads of one of the corner turrets of the lower portion and provided with an expansion slot, the locking ring comprises external threads for mounting, while the lower locking means additionally comprise an expansion member to be pushed into the locking ring for expanding the expansion slot of the locking ring in such a way that the locking ring is locked to the internal threads of one of the corner turrets of the lower portion.

12. An electronics and instrumentation enclosure according to claim 11, wherein the expansion member is conical at a lower end and is pushed entirely through a through opening of the locking ring for releasing the locking ring from the internal threads of one of the corner turrets of the lower portion in such a way that the locking ring is turned off from one of the corner turrets of the lower portion.

13. An electronics and instrumentation enclosure according to claim 2, wherein the expansion member is provided with a through opening.

14. An electronics and instrumentation enclosure according to claim 11, wherein the locking member comprises a head part and a locking part provided with said projecting locking element, which parts are mounted to each other by means of a snap joint.

15. An electronics and instrumentation enclosure according to claim 14, wherein the head part is key-shaped and comprises a head and a related male part, which is intended to be mounted into a recess in the locking part.

16. An electronics and instrumentation enclosure according to claim 15, wherein the spring element is a pressure spring arranged in the through opening of one of the corner turrets of the cover in such a way that a lower end is supported on a shoulder in a through opening, while an upper end is supported on a ring flange in the head part.

17. An electronics and instrumentation enclosure according to claim 16, wherein a biggest diameter of the locking part is bigger than a smallest diameter of the through opening of one of the corner turrets, which prevents the locking part from passing through the through opening of the one turret when the projecting locking element of the locking part has been released from the locking ring.

18. An electronics and instrumentation enclosure according to claim 14, wherein an upper end of the head part comprises two parts each having an opening, which parts are turnable with respect to each other in such a way that said openings of the two parts are positioned in line with respect to each other for mounting a jack lock or a seal through the openings of the two parts.

* * * * *

UNITED STATES PATENT AND TRADEMARK OFFICE
CERTIFICATE OF CORRECTION

PATENT NO. : 5,750,924
DATED : MAY 12, 1998
INVENTOR(S) : SONNTAG ET AL.

It is certified that error appears in the above-indentified patent and that said Letters Patent is hereby corrected as shown below:

Front page. [56] Foreign Application Priority Data: insert the following:

| | | | |
|---|---|---|---|
| Jun. 27, 1975 | [FR] | France | 2 253 397 |
| Feb. 17, 1977 | [DE] | Germany | 25 34 375 A1 |
| Apr. 23, 1992 | [DE] | Germany | 40 33 109 A1 |
| Aug. 27, 1992 | [DE] | Germany | 92 07 609 U1 |

Col. 7, line 4, claim 13: "2" should read —12—

Signed and Sealed this

Second Day of November, 1999

Q. TODD DICKINSON

*Attest:*

*Attesting Officer*      Acting Commissioner of Patents and Trademarks